United States Patent
Tanaka et al.

(10) Patent No.: US 10,291,244 B2
(45) Date of Patent: May 14, 2019

(54) ATOMIC OSCILLATOR AND TEMPERATURE CONTROL METHOD OF ATOMIC OSCILLATOR

(71) Applicant: Seiko Epson Corporation, Tokyo (JP)

(72) Inventors: Noriaki Tanaka, Chino (JP); Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 203 days.

(21) Appl. No.: 15/347,002

(22) Filed: Nov. 9, 2016

(65) Prior Publication Data

US 2017/0141783 A1 May 18, 2017

(30) Foreign Application Priority Data

Nov. 13, 2015 (JP) ................... 2015-222777

(51) Int. Cl.
| | |
|---|---|
| *H03L 1/02* | (2006.01) |
| *H03L 7/26* | (2006.01) |
| *H01S 5/022* | (2006.01) |
| *G04F 5/14* | (2006.01) |

(52) U.S. Cl.
CPC ............ *H03L 7/26* (2013.01); *G04F 5/145* (2013.01); *H01S 5/02296* (2013.01); *H03L 1/02* (2013.01)

(58) Field of Classification Search
CPC ......... H01S 5/02296; H03L 7/26; H03L 1/02; G04F 5/145

USPC .................................................. 331/3, 94.1
See application file for complete search history.

(56) References Cited

U.S. PATENT DOCUMENTS

| | | | |
|---|---|---|---|
| 8,947,169 B2 | 2/2015 | Tamura et al. | |
| 2012/0235755 A1* | 9/2012 | Chindo | G04F 5/145 331/94.1 |

FOREIGN PATENT DOCUMENTS

| | | |
|---|---|---|
| JP | 10-244375 A | 9/1998 |
| JP | 2009-231688 A | 10/2009 |
| JP | 2012-195788 A | 10/2012 |
| JP | 2013-236268 A | 11/2013 |
| JP | 2013-239776 A | 11/2013 |
| JP | 2015-041892 A | 3/2015 |

* cited by examiner

*Primary Examiner* — Arnold Kinkead
(74) *Attorney, Agent, or Firm* — Harness, Dickey & Pierce, P.L.C.

(57) ABSTRACT

An atomic oscillator includes at least a gas cell that has metal atoms sealed therein, a coil that is disposed in a vicinity of the gas cell, a first magnetic shield that accommodates the gas cell and the coil therein, a second magnetic shield that accommodates a heater heating the gas cell, a first temperature sensor detecting a temperature of the gas cell, and the first magnetic shield therein, and a temperature adjustment unit and a second temperature sensor that are disposed outside the second magnetic shield.

7 Claims, 11 Drawing Sheets

ATOMIC OSCILLATOR AND TEMPERATURE CONTROL METHOD OF ATOMIC OSCILLATOR

CROSS REFERENCE

This application claims the benefit of Japanese Application No. 2015-222777, filed on Nov. 13, 2015. The disclosure of the prior application is hereby incorporated by reference herein in its entirety.

BACKGROUND

1. Technical Field

The present invention relates to an atomic oscillator and a temperature control method of an atomic oscillator.

2. Related Art

An atomic oscillator is known which oscillates on the basis of energy transfer of atoms of an alkali metal such as rubidium or cesium. In general, an operating principle of the atomic oscillator is classified broadly into a method using a double resonance phenomenon based on light and microwaves and a method using a quantum interference effect (CPT: coherent population trapping) based on two types of light beams having different wavelengths.

In any type of atomic oscillator, an alkali metal is sealed in a gas cell together with a buffer gas, a detector provided on a side opposite to the gas cell detects how much light incident on the gas cell is absorbed into the alkali metal to thereby detect atomic resonance, and the detected atomic resonance is output as a reference signal by a control system. As such an atomic oscillator, a configuration is disclosed in which a gas cell is provided on a substrate, and a light source of light (excitation light) and a detecting unit are disposed on both sides of the gas cell (for example, see JP-A-2009-231688).

In addition, since an atomic oscillator using CPT is smaller than an atomic oscillator using a double resonance phenomenon, it is expected that an atomic oscillator is incorporated in various electronic apparatuses, and further reductions in the size and height of the atomic oscillator are desired.

An atomic oscillator is required to be small in size and low in height and to correspond to a wide range of temperature. However, in an atomic oscillator of the related art, there is an increasing concern for a problem such as oscillation characteristics of a gas cell becoming unstable under a high temperature environment.

SUMMARY

An advantage of some aspects of the invention is to provide an atomic oscillator capable of achieving reductions in size and height, suppressing unstability of oscillation characteristics due to changes in temperature within a gas cell, and maintaining stable oscillation characteristics.

The invention can be implemented as the following forms or application examples.

Application Example 1

An atomic oscillator according to this application example at least includes a gas cell that has metal atoms sealed therein, a coil that is disposed in a vicinity of the gas cell, and a first magnetic shield that accommodates the gas cell and the coil therein, the atomic oscillator including a second magnetic shield that accommodates a heater heating the gas cell, a first temperature sensor detecting a temperature of the gas cell, and the first magnetic shield therein, and a temperature adjustment unit and a second temperature sensor that are disposed outside the second magnetic shield.

In order to maintain an alkali metal within the gas cell in a gaseous state, the gas cell is heated and controlled by the heater. However, an external environment in which the atomic oscillator including the gas cell is installed, particularly, a temperature environment causes changes in temperature within the gas cell. For example, the gas cell is often at a temperature lower than a desired temperature at a point in time when the atomic oscillator is started up. In this case, when temperature is increased to a temperature for normally operating the atomic oscillator only by the heating of the heater, there is a concern that a time required to reach a predetermined temperature, that is, a so-called start-up time until the operation of the atomic oscillator is stabilized may be increased.

Alternatively, in a case where an external temperature is higher than a predetermined temperature within the gas cell, it is difficult to maintain the inside of the gas cell at a predetermined temperature due to heat transferred from the outside even when the operation of the heater is stopped. Consequently, according to the atomic oscillator of this application example, it is possible to more accurately perform management at a desired temperature of the gas cell by controlling a heating operation of the heater and a heat absorption operation or a heating operation of the temperature adjustment unit. For example, the heater is operated and the temperature adjustment unit is operated as a heating unit during the start-up of the atomic oscillator, and thus it is possible to increase the temperature of the gas cell in a short period of time. Alternatively, in a case where the surrounding environment of the atomic oscillator is an environment at a temperature higher than a desired temperature of the gas cell, the temperature adjustment unit is operated as a cooling unit, and thus it is possible to cool the temperature of the gas cell in a short period of time. Therefore, it is possible to obtain the atomic oscillator with a stable accuracy with respect to changes in an external temperature environment.

Application Example 2

The atomic oscillator according to the application example may further include a first temperature control unit that controls an operation of the heater on the basis of a detection temperature of the first temperature sensor, and a second temperature control unit that controls an operation of the temperature adjustment unit on the basis of a detection temperature of the second temperature sensor.

According to the above-mentioned application example, the second temperature control unit can apply an operation control current of the optimal temperature adjustment unit on the basis of external temperature detection results obtained by the second temperature sensor. Further, the first temperature sensor can detect the temperature of the gas cell and can control an operation current applied to the heater by the first temperature control unit on the basis of the data, to thereby maintain a desired management temperature of the gas cell. Therefore, it is possible to obtain the atomic oscillator with a stable accuracy with respect to changes in an external temperature environment.

Application Example 3

The atomic oscillator according to the application example may further include a power control unit that is provided between the temperature adjustment unit and the second temperature control unit and controls power which is supplied to the temperature adjustment unit.

According to the above-mentioned application example, the second temperature control unit can perform a control operation for operating the temperature adjustment unit as a cooling unit as a normal state. The power control unit can cut off or adjust the amount of power supplied from the second temperature control unit to the temperature adjustment unit by an external temperature environment, and thus it is possible to dispose the gas cell accommodated in the second magnetic shield in a predetermined temperature environment.

Application Example 4

In the atomic oscillator according to the application example, the temperature adjustment unit may be a Peltier element.

According to the above-mentioned application example, a direction in which an output current is applied from the second temperature control unit is switched, and thus it is possible to easily make the second temperature control unit function as a heating element or a cooling element.

Application Example 5

A temperature control method of an atomic oscillator according to this application example is a temperature control method of an atomic oscillator including at least a gas cell that has metal atoms sealed therein, a coil that is disposed in a vicinity of the gas cell, and a first magnetic shield that accommodates the gas cell and the coil therein, the atomic oscillator including a second magnetic shield that accommodates a heater heating the gas cell, a first temperature sensor detecting a temperature of the gas cell, and the first magnetic shield therein, a temperature adjustment unit and a second temperature sensor that are disposed outside the second magnetic shield, a first temperature control unit that controls an operation of the heater on the basis of a detection temperature of the first temperature sensor, and a second temperature control unit that controls an operation of the temperature adjustment unit on the basis of a detection temperature of the second temperature sensor. The temperature control method includes causing the first temperature control unit to control the heater so as to maintain the gas cell at a first temperature, and causing the second temperature control unit to control the temperature adjustment unit so as to maintain the first magnetic shield at a second temperature.

In order to maintain an alkali metal within the gas cell in a gaseous state, the gas cell is heated and controlled by the heater. However, an external environment in which the atomic oscillator including the gas cell is installed, particularly, a temperature environment causes changes in temperature within the gas cell. For example, the gas cell is often at a temperature lower than a desired temperature at a point in time when the atomic oscillator is started up. In this case, when temperature is increased to a temperature for normally operating the atomic oscillator only by the heating of the heater, there is a concern that a time required to reach a predetermined temperature, that is, a so-called start-up time until the operation of the atomic oscillator is stabilized may be increased.

Alternatively, in a case where an external temperature is higher than a predetermined temperature within the gas cell, it is difficult to maintain the inside of the gas cell at a predetermined temperature due to heat transferred from the outside even when the operation of the heater is stopped.

Consequently, according to the temperature control method of an atomic oscillator of this application example, it is possible to more accurately perform management at a desired temperature of the gas cell by controlling a heating operation of the heater and a heat absorption operation or a heating operation of the temperature adjustment unit. For example, the heater is operated and the temperature adjustment unit is operated as a heating unit during the start-up of the atomic oscillator, and thus it is possible to increase the temperature of the gas cell in a short period of time. Alternatively, in a case where the surrounding environment of the atomic oscillator is an environment at a temperature higher than a desired temperature of the gas cell, the temperature adjustment unit is operated as a cooling unit, and thus it is possible to cool the temperature of the gas cell in a short period of time. Therefore, it is possible to stably control the atomic oscillator required to have high accuracy with respect to changes in an external temperature environment.

Application Example 6

In the temperature control method of an atomic oscillator according to the application example, the second temperature may be lower than the first temperature.

According to the above-mentioned application example, the second temperature which is a management temperature of the second magnetic shield is made lower than the first temperature which is a management temperature of the gas cell, and thus the inner temperature of the second magnetic shield further accommodating the first magnetic shield having the gas cell accommodated therein is lower than the management temperature of the gas cell, and thus it is possible to stably perform temperature management of the gas cell by the temperature control of the heater. Therefore, it is possible to stably control the atomic oscillator required to have high accuracy.

Application Example 7

A temperature control method of an atomic oscillator according to this application example is a temperature control method of an atomic oscillator including at least a gas cell that has metal atoms sealed therein, a coil that is disposed in a vicinity of the gas cell, and a first magnetic shield that accommodates the gas cell and the coil therein, the atomic oscillator including a second magnetic shield that accommodates a heater heating the gas cell, a first temperature sensor detecting a temperature of the gas cell, and the first magnetic shield therein, a temperature adjustment unit and a second temperature sensor that are disposed outside the second magnetic shield, a first temperature control unit that controls an operation of the heater on the basis of a detection temperature of the first temperature sensor, and a second temperature control unit and a power control unit that control an operation of the temperature adjustment unit on the basis of a detection temperature of the second temperature sensor. The temperature control method includes causing the first temperature control unit to control the heater so as to maintain the gas cell at a first temperature, causing the second temperature control unit to control an operation of the temperature adjustment unit so as to maintain the first magnetic shield at a second temperature, and causing the power control unit to control an amount of power which is output to the temperature adjustment unit so as to maintain the first magnetic shield at a third temperature.

According to the temperature control method of an atomic oscillator of this application example, the second temperature control unit can perform a control operation of operating the temperature adjustment unit as a cooling element as a normal state. The power control unit can cut off or adjust the amount of power supplied from the second temperature control unit to the temperature adjustment unit by an external temperature environment, and thus it is possible to dispose the gas cell accommodated in the second magnetic shield in a predetermined temperature environment and to stably control the atomic oscillator required to have high accuracy.

Application Example 8

In the above-mentioned application example, in a case where the first temperature is set to T1, the second temperature is set to T2, and the third temperature is set to T3, a relation of T1>T3>T2 may be established.

According to the above-mentioned application example, a control current of the temperature adjustment unit which is applied from the second temperature control unit can make the temperature adjustment unit operate as a cooling unit as a normal state.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments according to the invention will be described with reference to the accompanying drawings.

First Embodiment

Figure 1:
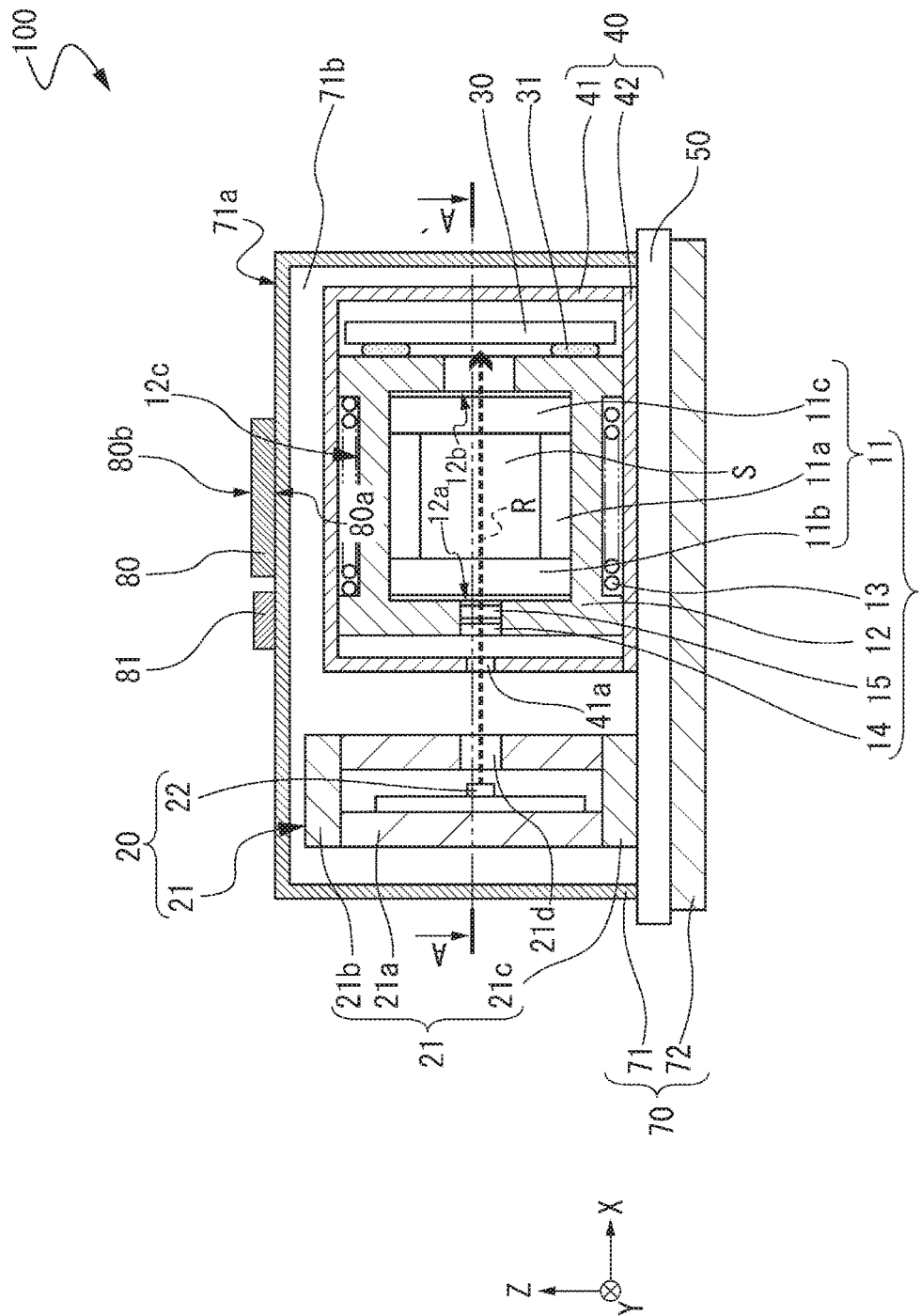
FIG. 1 is a schematic front cross-sectional view showing an outline of an atomic oscillator according to a first embodiment.
Figure 2:
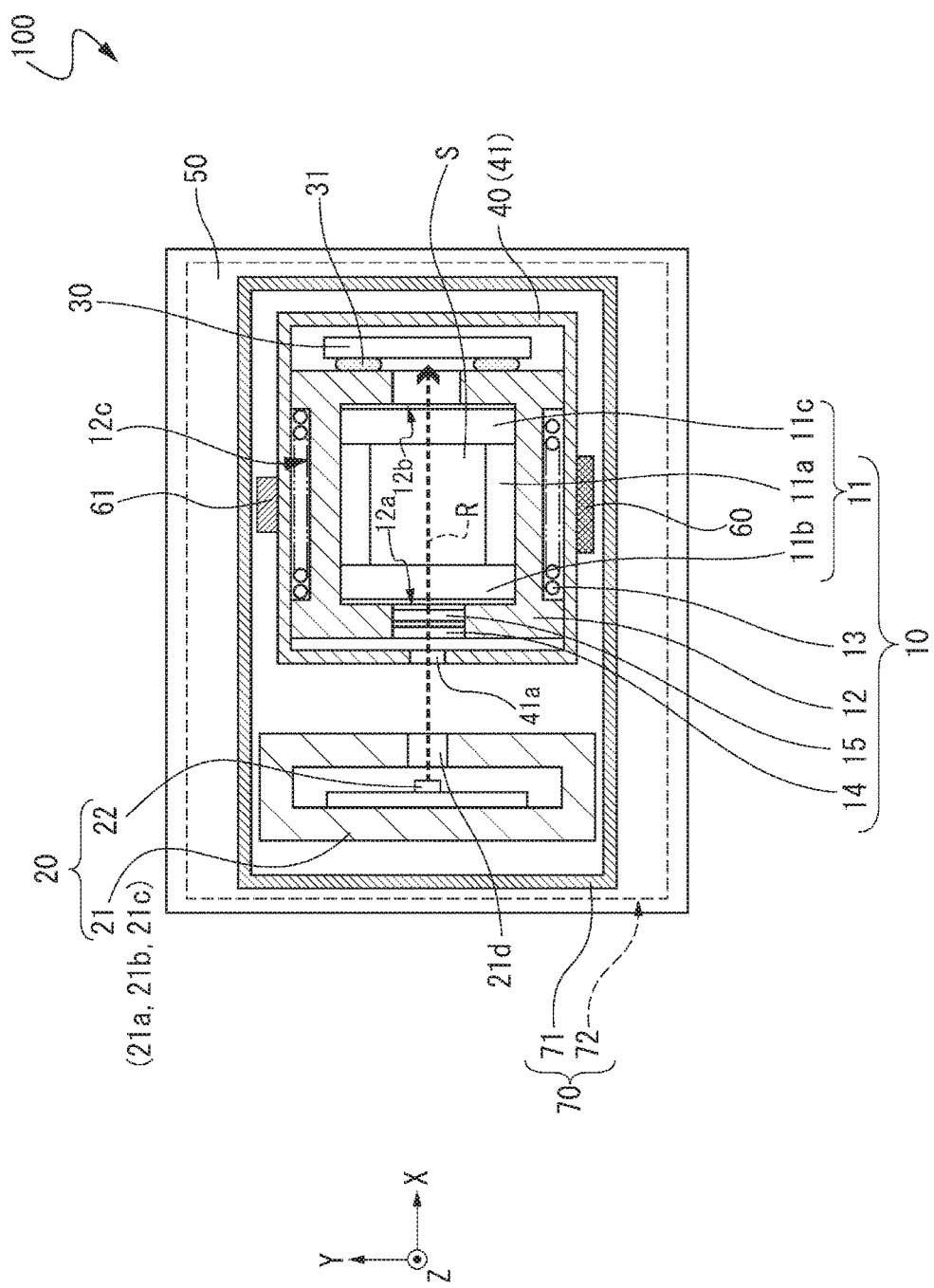
FIG. 2 is a cross-sectional view that shows an outline of the atomic oscillator according to the first embodiment and is taken along line A-A' shown in FIG. 1.

FIGS. 1 and 2 show an outline of an atomic oscillator according to a first embodiment, FIG. 1 is a front cross-sectional view, and FIG. 2 is a cross-sectional view taken along line A-A' shown in FIG. 1.

An atomic oscillator 100 shown in FIGS. 1 and 2 is an atomic oscillator using a quantum interference effect. The atomic oscillator 100 includes a gas cell unit 10, a light emission unit 20, and a first magnetic shield 40 that accommodates the gas cell unit 10 and has a magnetic shielding property in the atomic oscillator 100 according to this embodiment.

The gas cell unit 10 includes a gas cell 11, a gas cell holding member 12 that holds the gas cell 11 and transmits heat generated by a heater to be described later to the gas cell 11, and a coil 13 which is wound around the outer circumferential surface of the gas cell holding member 12 along the X-axis direction. In the gas cell 11, an internal space S is formed by a main body 11a having a columnar through hole and a pair of window portions 11b and 11c sealing openings on both side of the through hole. An alkali metal such as gaseous rubidium, cesium, or sodium is sealed in the internal space S of the gas cell 11.

The light emission unit 20 includes a light source container 21 constituted by a main body 21a having a columnar through hole and a pair of lids 21b and 21c that seal openings on both sides of the through hole, and a light source 22 which is accommodated in and fixed to the light source container 21. The light source 22 has a function of emitting excitation light for exciting alkali metal atoms in the gas cell 11. The light source 22 is disposed so as to face the gas cell 11 along an emission direction (optical axis direction R of an arrow shown in the drawing) of excitation light inside the light source container 21, a through hole 21d is provided in a region of the main body 21a which intersects the emission direction of the excitation light, and the excitation light is emitted toward the gas cell 11 from the light source 22 through the through hole 21d.

The emitted excitation light passes through optical components 14 and 15 disposed in a through hole 12a on the light emission unit 20 side among through holes 12a and 12b formed in a portion in which the gas cell holding member 12 and the optical axis direction R intersect each other. In this embodiment, the optical components 14 and 15 are disposed in this order from the light source 22 side to the gas cell 11 side. The optical component 14 is a λ/4 wavelength plate. Thereby, it is possible to convert the excitation light, which is emitted from the light source 22, from linearly polarized light into circularly polarized light (right circularly polarized light or left circularly polarized light). The optical component 15 is a neutral density filter (ND filter). Thereby, it is possible to adjust (reduce) the intensity of excitation light incident on the gas cell 11. For this reason, even when an output of the light source 22 is large, it is possible to set the amount of excitation light incident on the gas cell 11 to a desired amount.

The coil 13 is wound around an outer circumferential portion 12c, which is parallel to the optical axis direction R of the gas cell holding member 12, along the outer circumferential portion 12c. The coil 13 has a function of generating a magnetic field by electrical conduction. Thereby, a magnetic field is applied to the alkali metal in the gas cell 11, and thus it is possible to improve a resolution by widening a gap between different energy levels at which the alkali metal degenerates, by Zeeman splitting. As a result, it is possible to increase accuracy of an oscillation frequency of the atomic oscillator 100. Meanwhile, the magnetic field generated by the coil 13 may be either a DC magnetic field or an AC magnetic field, or may be a magnetic field in which a DC magnetic field and an AC magnetic field overlap each other. In addition, the coil 13 may be a solenoid coil provided so as to surround the gas cell 11, or may be a Helmholtz coil provided so as to have the gas cell 11 interposed therein.

A light detection unit 30 is provided at a position facing the light emission unit 20 along the optical axis direction R with the gas cell 11 interposed therebetween. The light detection unit 30 has a function of detecting the intensity of excitation light LL (resonance light beam 1 and resonance light beam 2) to be described later which has passed through the gas cell 11. In this embodiment, the light detection unit 30 is bonded to the gas cell holding member 12 through an adhesive 31. Here, a known adhesive can be used as the adhesive 31. In addition, the light detection unit 30 is not particularly limited as long as the unit can detect the above-mentioned excitation light. For example, a photodetector (light-receiving element) such as a solar cell or a photodiode can be used.

The gas cell unit 10 and the light detection unit 30 mentioned above are accommodated in the first magnetic shield 40. The first magnetic shield 40 includes a base portion 42 mounted on a substrate 50, and a box-shaped first lid 41. The first magnetic shield 40 is configured by putting the first lid 41 on the gas cell unit 10 which includes the light detection unit 30 mounted on the base portion 42 so as to cover the gas cell unit 10 and fitting the first lid to the base portion 42. The first magnetic shield 40 has a function of shielding magnetism applied from the outside with respect to the inside of the first magnetic shield 40, and shields magnetism applied from the outside with respect to the gas cell unit 10 accommodated in the first magnetic shield 40.

A through hole 41a is provided at a position facing the through hole 12a formed in the gas cell holding member 12 of the first lid 41, that is, a position where excitation light passes. Meanwhile, a material which is airtightly bonded to the through hole 41a is not particularly limited as long as the material is capable of transmitting excitation light. For example, transparent glass, transparent quartz glass, transparent crystal, or the like may be airtightly bonded thereto. In this manner, it is possible to set the inside of the first magnetic shield 40 as an airtight space by the airtight bonding of the through hole 41a. Although not shown in FIGS. 1 and 2, a component other than the above-mentioned components may be accommodated in the first magnetic shield 40. Although not shown in the drawing, the substrate 50 may be provided with a plurality of wirings for allowing electrical conduction from the outside of the first magnetic shield 40 to the gas cell unit 10, and the like.

It is preferable that the constituent materials of the first lid 41 and the base portion 42 have a magnetic shielding effect, and soft magnetic materials such as iron (Fe), various Fe alloys (silicon iron, permalloy, supermalloy, amorphous, and sendust), copper (Cu), and a copper alloy are preferably used. These materials are used for the first lid 41 and the base portion 42, and thus it is possible to shield magnetism (changes in a magnetic field) which is applied from the outside by the first magnetic shield 40. Thereby, it is possible to suppress influence on metal atoms within the gas cell 11 due to magnetism (changes in a magnetic field) which is applied from the outside and to achieve the stability of oscillation characteristics as the atomic oscillator 100.

The first lid 41 is bonded to the base portion 42, and an opening of the first lid 41 is sealed by the base portion 42. A method of bonding the base portion 42 and the first lid 41 to each other is not particularly limited. For example, brazing, seam welding, energy beam welding (laser welding, electron beam welding, or the like), or the like can be used. Meanwhile, a bonding member for bonding the base portion 42 and the first lid 41 to each other may be interposed therebetween.

In addition, it is preferable that the base portion 42 and the first lid 41 are airtightly bonded to each other. That is, it is preferable that the inside of the first magnetic shield 40 is an airtight space. Thereby, it is possible to set the inside of the first magnetic shield 40 to be in a decompression state or a state where an inert gas is sealed. As a result, it is possible to improve characteristics of the atomic oscillator 100. In particular, it is preferable that the inside of the first magnetic shield 40 is in a decompression state. Thereby, it is possible to suppress the transmission of heat through a space in the first magnetic shield 40. For this reason, it is possible to suppress heat interference between the gas cell holding member 12 and the outside of the first magnetic shield 40 and between the gas cell 11 and a heater to be described later through the space in the first magnetic shield 40. For this reason, heat of the heater is effectively transmitted to the two window portions 11b and 11c through the gas cell holding member 12, and thus it is possible to suppress a temperature difference between the two window portions 11b and 11c. In addition, it is possible to more effectively suppress the transmission of heat between the gas cell unit 10 and the outside of the first magnetic shield 40.

As shown in FIG. 2, the atomic oscillator 100 according to this embodiment includes a heater 60 as a heating element that heats the gas cell unit 10. The heater 60 is a heating resistor (heating unit) that generates heat by electrical conduction. The heater 60 is disposed outside the first magnetic shield 40, and heat generated by the heater 60 is transmitted to the gas cell 11 through the first magnetic shield 40. The heat generated by the heater 60 is transmitted to the gas cell 11 to maintain the gas cell 11 at a predetermined temperature, and thus it is possible to maintain the alkali metal in the gas cell 11 in a gaseous state.

In the atomic oscillator 100 according to this embodiment, a description is given of a configuration in which the heater 60 is bonded and fixed to the outside of the first lid 41 of the first magnetic shield 40 by an adhesive having a high thermal conductivity. However, the invention is not limited thereto, and means for disposing the heater 60 is not limited as long as the means reduces a transmission loss of heat generated by the heater 60. For example, the means may be brazing using metal brazing or physical fixing means using a screw. Meanwhile, a Peltier element may be used instead of the heater 60 or in conjunction with the heater 60. In this case, a portion of the Peltier element on the heat generation side constitutes the heating unit.

The operation of the heater 60 is controlled so that the internal temperature of the first magnetic shield 40, that is, the ambient temperature of the gas cell 11 is set to be management target temperature by heat transmitted from the heater 60 with a predetermined temperature to be maintained of the gas cell 11 as a management temperature target value. At this time, a first temperature sensor 61 (hereinafter, referred to as a first sensor 61) which detects the internal temperature of the gas cell 11, that is, the first magnetic shield 40 may be provided outside the first magnetic shield 40.

The first sensor 61 detects the outer surface temperature of the first magnetic shield 40, and a relationship between the ambient temperature of the gas cell 11, that is, the internal temperature of the first magnetic shield 40 and the outer surface temperature of the first magnetic shield 40 is obtained. Accordingly, a temperature control unit to be described later can convert the outer surface temperature of the first magnetic shield 40, which is detected by the first sensor 61, into the internal temperature of the first magnetic shield 40 and can use the converted temperature as detection temperature data of the gas cell 11.

In addition, as shown in FIGS. 1 and 2, the atomic oscillator 100 includes a second magnetic shield 70 that has a magnetic shielding property and accommodates the first magnetic shield 40 having the gas cell unit 10 accommodated therein, the light detection unit 30, the heater 60, the first sensor 61, and the light emission unit 20 therein. The second magnetic shield 70 includes a bottom 72 and a second lid 71, and an opening of the second lid 71 is sealed by the substrate 50. Thereby, a space for accommodating the first magnetic shield 40 is formed. The bottom 72 is disposed on a surface opposite to the surface of the substrate 50 on which the second lid 71 is disposed, thereby configuring the second magnetic shield 70 that shields the inside of the atomic oscillator from the external magnetism.

It is preferable that the constituent materials of the second lid 71 and the bottom 72 have a magnetic shielding effect, and soft magnetic materials such as iron (Fe), various Fe alloys (silicon iron, permalloy, supermalloy, amorphous, and sendust), copper (Cu), and a copper alloy are preferably used. These materials are used for the second lid 71 and the bottom 72, and thus it is possible to shield magnetism (changes in a magnetic field) which is applied from the outside by the second magnetic shield 70. In addition, a double magnetic shield having the second magnetic shield 70 and the first magnetic shield 40 provided with an air layer or a low magnetic permeability layer of the substrate 50 is configured, and thus it is possible to more effectively suppress influence on the metal atoms in the gas cell 11 due to magnetism (changes in a magnetic field) which is applied from the outside.

As shown in FIG. 1, a Peltier element 80 as a temperature adjustment unit is disposed on a upper external surface 71a of the second lid 71 in the second magnetic shield 70. As is well known, the Peltier element 80 is an element configured such that the transfer of heat between one surface 80a (hereinafter, referred to as a connection surface 80a) which is connected to the upper external surface 71a of the second lid 71 depending on the direction of a current to be applied thereto and the other surface 80b (hereinafter, referred to as a release surface 80b) is suppressed.

For example, a current in a direction for performing heat transfer from the connection surface 80a toward the release surface 80b is applied, and thus the connection surface 80a serves as a cooling surface (low temperature surface) and the release surface 80b serves as a heating surface (high temperature surface). A current in a direction opposite thereto is applied, and thus it is also possible to make the connection surface 80a serve as a heating surface (high temperature surface) and to make the release surface 80b serve as a cooling surface (low temperature surface). Therefore, a current applied to the Peltier element 80 is controlled by a control unit, not shown, described later, and thus it is possible to cool or heat the second magnetic shield 70 and to cool or heat an internal space 71b of the second lid 71 of the second magnetic shield 70. In other words, a current applied to the Peltier element 80 is controlled, and thus it is possible to cool or heat the gas cell unit 10 through the first magnetic shield 40 accommodated in the second magnetic shield 70.

As described above, the substrate 50 is configured such that the second lid 71 of the second magnetic shield 70 that covers the first magnetic shield 40 accommodating the gas cell unit 10 and the light emission unit 20 including the light source 22 emitting excitation light is connected to one surface of the substrate 50. In addition, the bottom 72 constituting the second magnetic shield 70 is connected to the back face of one surface of the substrate 50. Meanwhile, the constituent material of the substrate 50 is not particularly limited. For example, a resin material, a ceramic material, or the like can be used. Although not shown in the drawing, a plurality of wirings and a plurality of terminals for allowing electrical conduction to the gas cell unit 10 or the light emission unit 20 from the outside are provided on the substrate 50.

Figure 3:
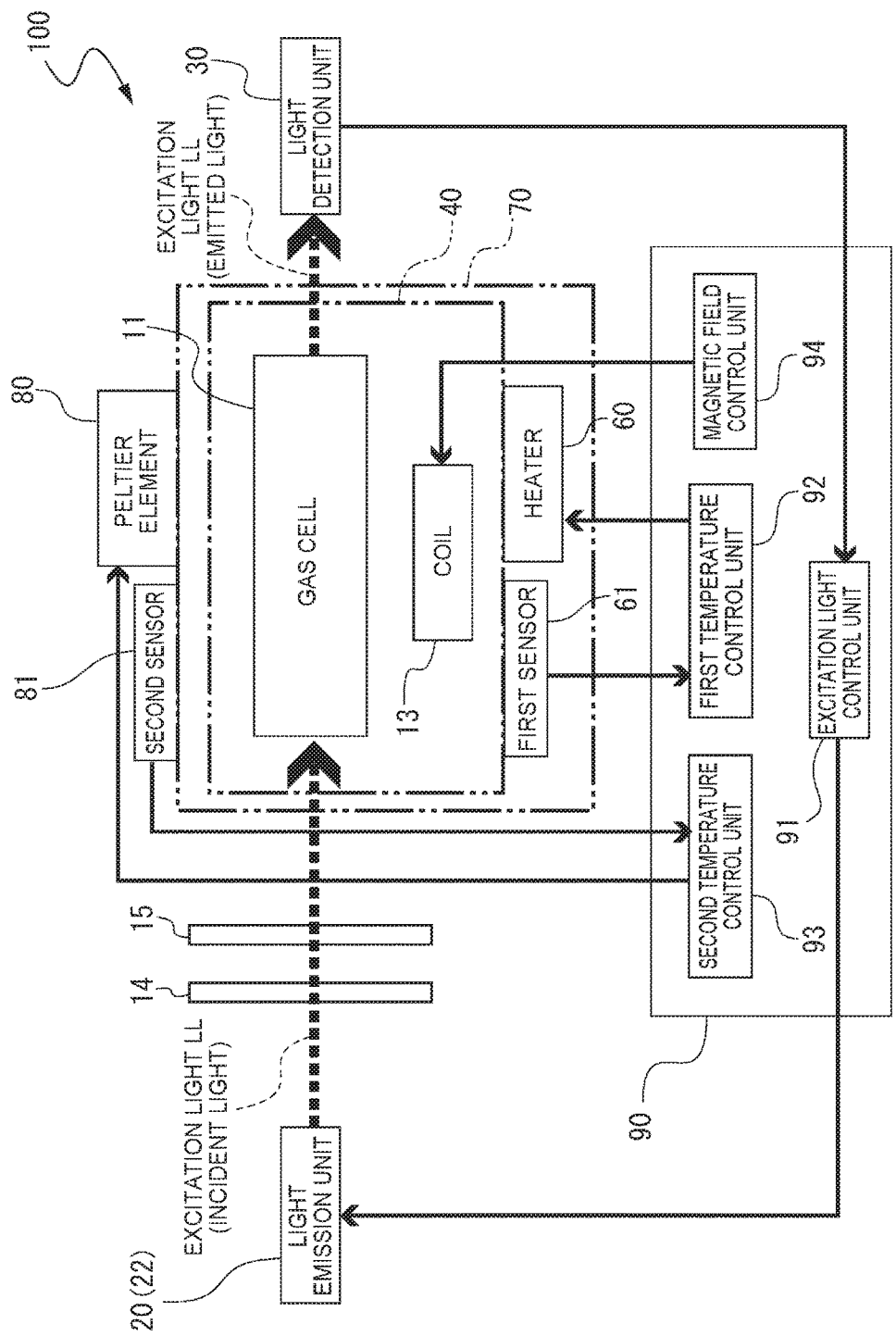
FIG. 3 is a schematic diagram showing a configuration of the atomic oscillator shown in FIGS. 1 and 2.
Figure 4:
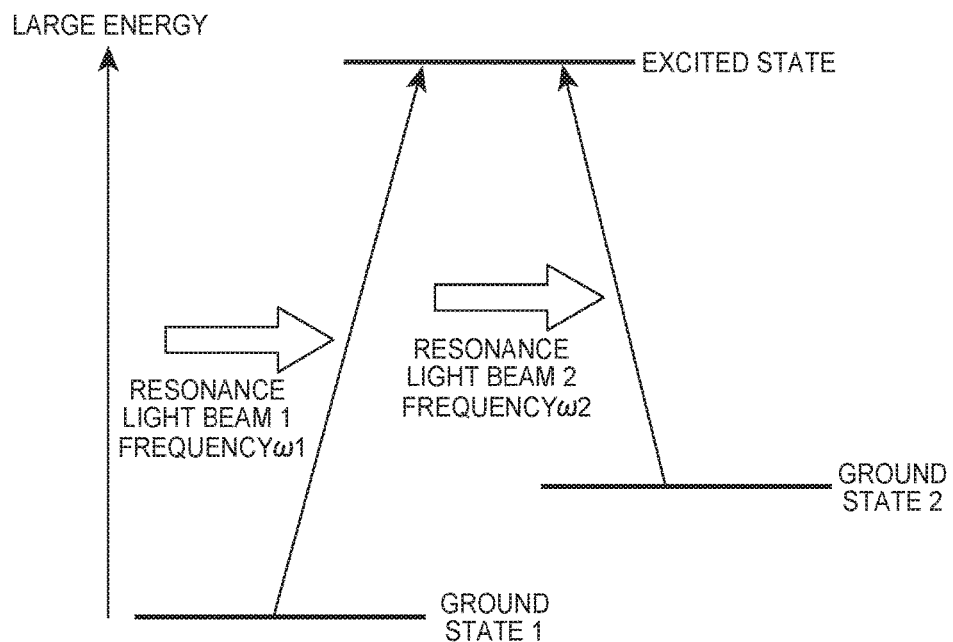
FIG. 4 is a diagram showing an energy state of an alkali metal within a gas cell of the atomic oscillator according to the first embodiment.
Figure 5:
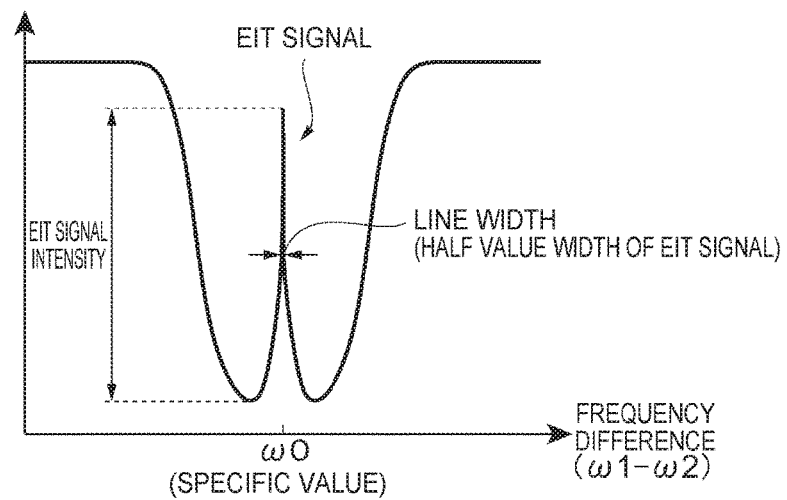
FIG. 5 is a graph showing a relationship between intensity of light detected by a light detection unit and a frequency difference between two light beams emitted from a light emission unit (light source) with respect to the light emission unit (light source) and the light detection unit of the atomic oscillator according to the first embodiment.

FIG. 3 is a schematic diagram showing a basic configuration of the atomic oscillator 100 shown in FIGS. 1 and 2. In addition, FIG. 4 is a diagram showing an energy state of an alkali metal within the gas cell 11 of the atomic oscillator 100 shown in FIGS. 1 and 2, and FIG. 5 is a graph showing a relationship between intensity of light detected by a light detection unit and a frequency difference between two light beams emitted from the light emission unit 20 (light source 22) with respect to the light emission unit 20 (light source 22) and the light detection unit 30 of the atomic oscillator 100 shown in FIGS. 1 and 2.

When such a gaseous alkali metal is irradiated with the two types of resonance light beams 1 and 2 having different frequencies, the light absorptivity (light transmittance) of the resonance light beams 1 and 2 in the alkali metal changes in accordance with a difference ($\omega1-\omega2$) between a frequency $\omega1$ of the resonance light beam 1 and a frequency $\omega2$ of the resonance light beam 2. When the difference ($\omega1-\omega2$) between the frequency $\omega1$ of the resonance light beam 1 and the frequency $\omega2$ of the resonance light beam 2 is coincident with a frequency equivalent to an energy difference between the ground state 1 and the ground state 2, excitation to the excited state from each of the ground states 1 and 2 is stopped. At this time, both the resonance light beams 1 and 2 pass without being absorbed into the alkali metal. Such a phenomenon is referred to as a coherent population trapping (CPT) phenomenon or an electromagnetically induced transparency (EIT) phenomenon.

The light source 22 emits the above-described two types of light beams (resonance light beam 1 and resonance light beam 2) having different frequencies toward the gas cell 11. For example, when the difference ($\omega1-\omega2$) between the frequency $\omega1$ of the resonance light beam 1 and the frequency ω2 of the resonance light beam 2 is coincident with a frequency ω0 equivalent to an energy difference between the ground state 1 and the ground state 2 in a case where the light source 22 fixes the frequency ω1 of the resonance light beam 1 and changes the frequency ω2 of the resonance light beam 2, the detection intensity of the light detection unit 30 sharply increases as shown in FIG. 5. Such a sharp signal is detected as an EIT signal. The EIT signal has an eigen value which is determined in accordance with the type of alkali metal. Therefore, it is possible to configure an oscillator by using such an EIT signal.

In the atomic oscillator 100 according to this embodiment, excitation light LL is emitted from the light source 22 included in the light emission unit 20 toward the gas cell 11 as light incident on the gas cell 11, as shown in FIG. 3. As the excitation light LL, two types of light beams (resonance light beam 1 and resonance light beam 2) which have different frequencies are emitted, as described above. The frequency ω1 of the resonance light beam 1 is capable of exciting the alkali metal in the gas cell 11 from the above-mentioned ground state 1 to an excited state. In addition, the frequency ω2 of the resonance light beam 2 is capable of exciting the alkali metal in the gas cell 11 from the above-mentioned ground state 2 to an excited state. The light source 22 is not particularly limited as long as the light source is capable of emitting the above-described excitation light, but a semiconductor laser such as, for example, a vertical cavity surface emitting laser (VCSEL) can be used as the light source.

The excitation light LL emitted from the light emission unit 20 passes through the optical components 14 and 15 provided in the through hole 12a which is formed in the gas cell holding member 12 in the optical axis direction R of the excitation light LL. The optical component 14 is a λ/4 wavelength plate and can convert the excitation light LL which is linear polarized light emitted from the light source 22 into circularly polarized light (right circularly polarized light or left circularly polarized light). Next, the optical component 15 is a neutral density filter (ND filter) and can adjust (reduce) the intensity of the excitation light LL incident on the gas cell 11. Accordingly, even when an output of the light source 22 is large, it is possible to set the amount of excitation light LL incident on the gas cell 11 to a desired amount.

When alkali metal atoms within the gas cell 11 are irradiated with the excitation light LL which is circularly polarized light in a state where Zeeman splitting of the alkali metal atoms occurs due to a magnetic field of the coil 13 by the excitation light LL being converted into circularly polarized light by the optical component 14, the number of alkali metal atoms at a desired energy level, among a plurality of levels at which Zeeman splitting of the alkali metal atoms occurs, can be made to be relatively larger than the number of alkali metal atoms at another energy level by an interaction between the excitation light LL and the alkali metal atoms. For this reason, the number of atoms expressing a desired EIT phenomenon is increased, and thus the intensity of a desired EIT signal is increased. As a result, it is possible to improve oscillation characteristics of the atomic oscillator 100. Meanwhile, in addition to a wavelength plate and a neutral density filter, another optical component such as a lens or a polarizing plate may be disposed between the light source 22 and the gas cell 11. In addition, the optical component 15 may be omitted depending on the intensity of the excitation light LL emitted from the light source 22.

The intensity of the excitation light LL (resonance light beam 1 and resonance light beam 2) that has passed through the gas cell 11 is detected by the light detection unit 30. Detection results of the excitation light LL which are obtained by the light detection unit 30 are input to an excitation light control unit 91 included in the control unit 90 (not shown in FIGS. 1 and 2), and frequencies of the resonance light beams 1 and 2 emitted from the light source 22 are controlled by the detection results obtained by the light detection unit 30. More specifically, the excitation light control unit 91 controls the frequencies of the resonance light beams 1 and 2 emitted from the light source 22 so that the above-mentioned difference (ω1−ω2) which is detected by the light detection unit 30 is set to be a frequency ω0 inherent in the above-mentioned alkali metal. In addition, the excitation light control unit 91 controls a center frequency of the resonance light beams 1 and 2 emitted from the light source 22. Thereby, it is possible to detect the above-described EIT signal. The control unit 90 outputs a signal of a quartz crystal oscillator not shown in the drawing, in synchronization with the EIT signal.

Further, the control unit 90 is provided with a first temperature control unit 92 as a first temperature control unit that controls the heater 60 heating the gas cell 11 to a predetermined temperature, a second temperature control unit 93 as a second temperature control unit that controls the operation of the Peltier element 80 disposed in the second magnetic shield 70, and a magnetic field control unit 94. As shown in FIG. 2, the first temperature control unit 92 controls electrical conduction to the heater 60 and controls the amount of heat supplied to the gas cell 11 on the basis of measurement detection results obtained by the first sensor 61 that detects the temperature of the gas cell 11 through the first magnetic shield 40 as shown in FIG. 2. In addition, the second temperature control unit 93 controls a current applied to the Peltier element 80 on the basis of the temperature of the second magnetic shield 70 as shown in FIG. 1, that is, measurement detection results obtained from a second temperature sensor 81 (hereinafter, referred to as a second sensor 81) which detects the internal space 71b of the second lid 71, switches the connection surface 80a of the Peltier element 80 to a cooling surface or a heating surface, and controls the amount of heat absorbed into or the amount of heat radiated from the connection surface 80a. It is possible to maintain the gas cell 11 in a desired temperature environment by the heating of the heater 60 and heat absorption or heat radiation of the Peltier element 80.

In order to maintain the alkali metal in the gas cell 11 in a gaseous state as described above, the gas cell 11 is heated and controlled by the heater 60. However, an external environment in which the atomic oscillator 100 including the gas cell 11 is installed, particularly, a temperature environment causes changes in temperature within the gas cell 11. For example, the gas cell 11 is often at a temperature lower than a desired temperature at a point in time when the atomic oscillator 100 is started up. In this case, when temperature is increased to a temperature for normally operating the atomic oscillator only by the heating of the heater 60, there is a concern that a time required to reach a predetermined temperature, that is, a so-called start-up time until the operation of the atomic oscillator 100 is stabilized may be increased.

Alternatively, in a case where an external temperature is higher than a predetermined temperature within the gas cell 11, it is difficult to maintain the inside of the gas cell 11 at a predetermined temperature due to heat transferred from the outside even when the operation of the heater 60 is stopped. In addition, in a case where the gas cell 11 is heated by the heater 60, electrical conduction to the heater 60 is performed until the gas cell 11 reaches the predetermined temperature or immediately before the gas cell reaches the predetermined temperature, and an operation of shielding electrical conduction at a point in time when the gas cell 11 reaches a desired temperature is performed. However, the temperature of the gas cell 11 which starts to rise is not maintained at the desired temperature simultaneously with the shielding of power, and a so-called overshoot in which the temperature of the gas cell 11 rises over a desired temperature and then falls may also occur.

Consequently, it is possible to more accurately perform management at a desired temperature of the gas cell 11 by controlled a heating operation of the heater 60 and a heat absorption operation or a heating operation of the Peltier element 80. For example, the heater 60 is operated and an operation is performed with the connection surface 80a of the Peltier element 80 as a heating surface during the start-up of the atomic oscillator 100, and thus it is possible to increase the temperature of the gas cell 11 in a short period of time. Alternatively, in a case where the heating of the gas cell 11 which is performed by the heater 60 is overshot or in a case where the surrounding environment of the atomic oscillator 100 is an environment at a temperature higher than a desired temperature of the gas cell 11, an operation is performed with the connection surface 80a of the Peltier element 80 as a cooling surface, and thus it is possible to cool the temperature of the gas cell 11 in a short period of time.

The magnetic field control unit 94 included in the control unit 90 controls electrical conduction to the coil 13 so that a magnetic field generated by the coil 13 becomes constant. Meanwhile, the control unit 90 is provided on, for example, an electronic circuit device (for example, a semiconductor device) which is mounted on amounting substrate on which the atomic oscillator 100 is mounted. Meanwhile, the control unit 90 may be provided inside the second magnetic shield 70 or the first magnetic shield 40.

Meanwhile, in the atomic oscillator 100 according to this embodiment, one heater 60 and one first sensor 61 are disposed outside the first magnetic shield 40 and one Peltier element 80 and one second sensor 81 are disposed outside the second magnetic shield 70, but the invention is not limited thereto. The number of temperature sensors and the arrangement position thereof may be appropriately set on the basis of an environment in which the atomic oscillator 100 is installed, temperature management conditions to be required, or the like.

Second Embodiment

Figure 6:
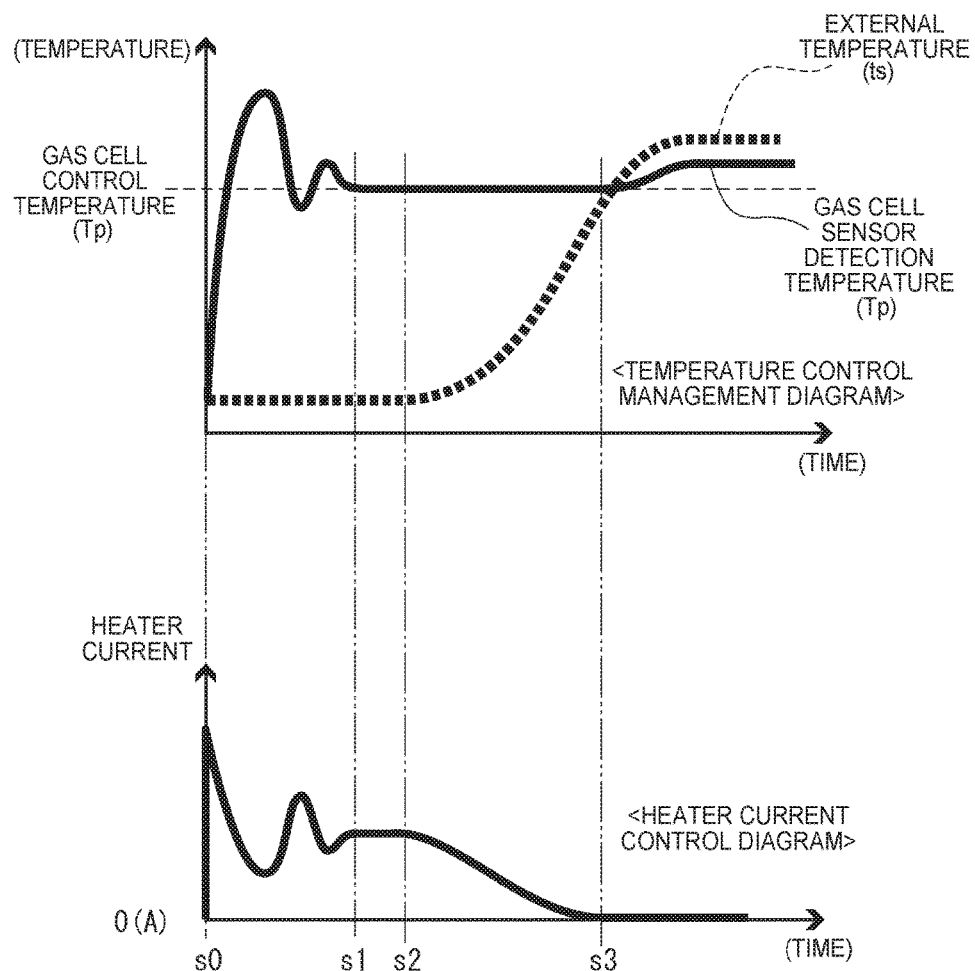
FIG. 6 shows a control management diagram showing the temperature control of a gas cell and a heater current control diagram in the related art.

As a second embodiment, a temperature control method of the atomic oscillator 100 according to the first embodiment will be described. As shown in FIG. 6 showing a control management diagram and a heater current control diagram which indicate the control of temperature of a gas cell in the related art, a start-up current is applied to a heater at the time of supplying power to an atomic oscillator (s0), an increase and decrease in a current applied to the heater are repeated until it is detected that a gas cell sensor detection temperature tp (hereinafter, referred to as a detection temperature tp) is stabilized at a gas cell control temperature Tp (hereinafter, referred to as a control temperature Tp), and a current applied to the heater has a stabilized value from a time s1 at which the control temperature Tp is stably detected on the basis of the detection temperature tp.

However, when the external temperature ts of the gas cell starts to rise after a time s2, a current applied to the heater is reduced so that the temperature of the gas cell, that is, the detection temperature tp is stabilized at the control temperature Tp. However, heat is supplied to the gas cell from the external temperature ts at a time s3 when the external temperature ts satisfies the relation of ts>Tp, and thus a current applied to the heater is cut off. However, the gas cell is maintained in a state the temperature thereof exceeds the control temperature Tp by the heat being continuously supplied to the gas cell from the external temperature ts, and thus it is difficult to exhibit high-accuracy oscillation performance.

Consequently, in the atomic oscillator 100 according to the first embodiment, it is possible to obtain a high-accuracy oscillation performance by the temperature control method of the atomic oscillator 100 according to the second embodiment.

Figure 7:
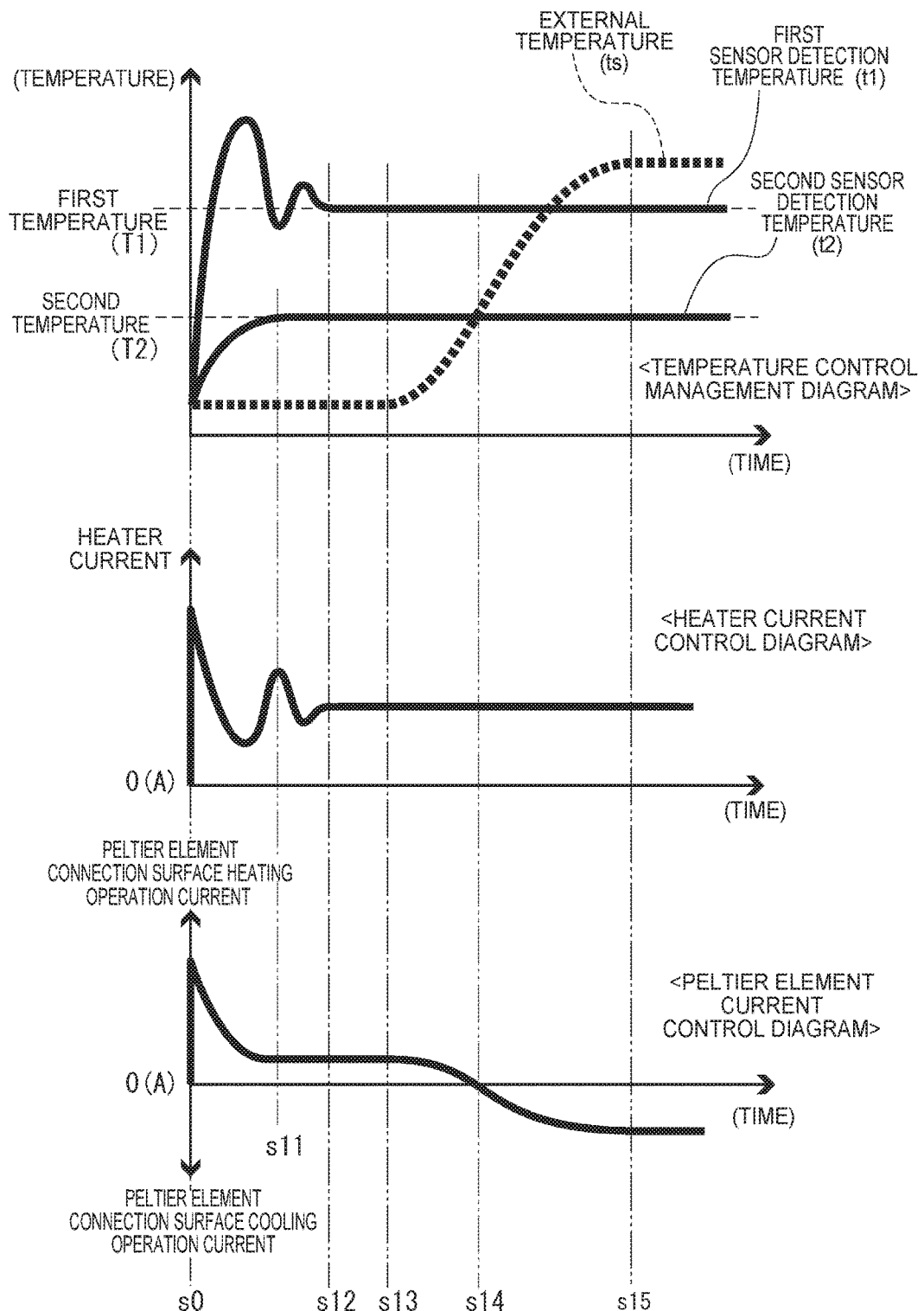
FIG. 7 shows a temperature control management diagram of a gas cell showing a temperature control method of an atomic oscillator according to the first embodiment, a heater current control diagram, and a current control diagram of a Peltier element (temperature adjustment unit), as a second embodiment.

FIG. 7 shows a temperature control management diagram of a gas cell 11 indicating the temperature control method of the atomic oscillator 100 according to the second embodiment, a heater current control diagram of a heater 60, and a Peltier element current control diagram of a Peltier element 80.

As shown in FIG. 7, the atomic oscillator 100 is started up at a time s0. In this example, a description is given of an example in which, at this time, the atomic oscillator is oscillated from a state where an external temperature ts in a region outside a second magnetic shield 70 satisfies the relations of ts<T1 of ts<T2 with respect to a first temperature T1 which is a control management temperature in a first temperature control unit 92 that controls at least the temperature of the gas cell 11 and a second temperature T2 which is a control management temperature in a second temperature control unit 93 that controls the temperature of a connection surface 80a of the Peltier element 80.

As described above, the Peltier element 80 included in the second magnetic shield 70 has a function of cooling an internal space 71b through the second magnetic shield 70 so that the temperature of the gas cell 11 does not exceed the first temperature T1 due to the external temperature ts in the region outside the second magnetic shield 70 being set to a high temperature exceeding the first temperature T1 and a rise in the temperature of the internal space 71b of the second magnetic shield 70. Therefore, it is preferable that the second temperature T2 and the first temperature T1 are set to satisfy the relation of T2<T1.

The relations of ts<T1 and ts<T2 are established at the time s0 during the start-up of the atomic oscillator, and the relation of t1<T1 is established. Accordingly, a start-up current is applied to the heater 60, and the heater 60 starts to heat the gas cell 11. In addition, a connection surface heating current is supplied to the Peltier element 80 so that a detection temperature t2 of a second sensor 81 is set to the second temperature T2.

The temperature of the gas cell 11 is increased by heating of the heater 60 and heating of the Peltier element 80, and a current (power) required to maintain a first magnetic shield at the first temperature T1 is supplied to the heater 60 when the temperature of the gas cell 11, that is, a detection temperature t1 of a first sensor 61 converges to the first temperature T1 at a time s12.

At a time s11 when the detection temperature t2 of the second sensor 81 converges to the second temperature T2, a current (power) required to maintain a temperature t2 detected by the second sensor 81 at the second temperature T2 is supplied to the Peltier element 80.

In this embodiment, a situation in which the external temperature ts starts to rise from a time s13 will be described. The external temperature ts starts to rise from the time s13, and thus the second temperature control unit 93 reduces a current applied to the Peltier element 80 in association with a rise in the external temperature ts so as to maintain the second temperature T2. A cooling operation current for operating the connection surface 80a of the Peltier element 80 as a cooling surface is applied from the second temperature control unit 93 at a time s14 when the external temperature ts is set to the second temperature T2.

The current applied to the Peltier element 80 from a time s15 when the external temperature ts is set to be in a constant temperature state as shown in this example is maintained at the detection temperature t2 of the second sensor 81, that is, a cooling operation current value in which the second magnetic shield 70 is maintained at the second temperature T2.

As described above, in the temperature control method of the atomic oscillator 100 according to the second embodiment, a current for operating the connection surface 80a of the Peltier element 80 as a heating surface or a cooling surface is applied to the Peltier element 80 from the second temperature control unit 93 with the second temperature T2 detected by the second sensor 81 as a threshold value so that the connection surface 80a of the Peltier element 80 is operated as a heating surface or a cooling surface in order to maintain the first temperature T1 for stably operating the gas cell 11 with high accuracy even when a temperature environment having the atomic oscillator 100 disposed therein changes. The second magnetic shield further accommodating the first magnetic shield accommodating the gas cell 11 is maintained at the second temperature T2, and thus it is possible to maintain the first temperature T1 which is a temperature for stably operating the gas cell 11. Therefore, it is possible to obtain the atomic oscillator 100 having a stable high-accuracy oscillation performance.

Third Embodiment

Figure 8:
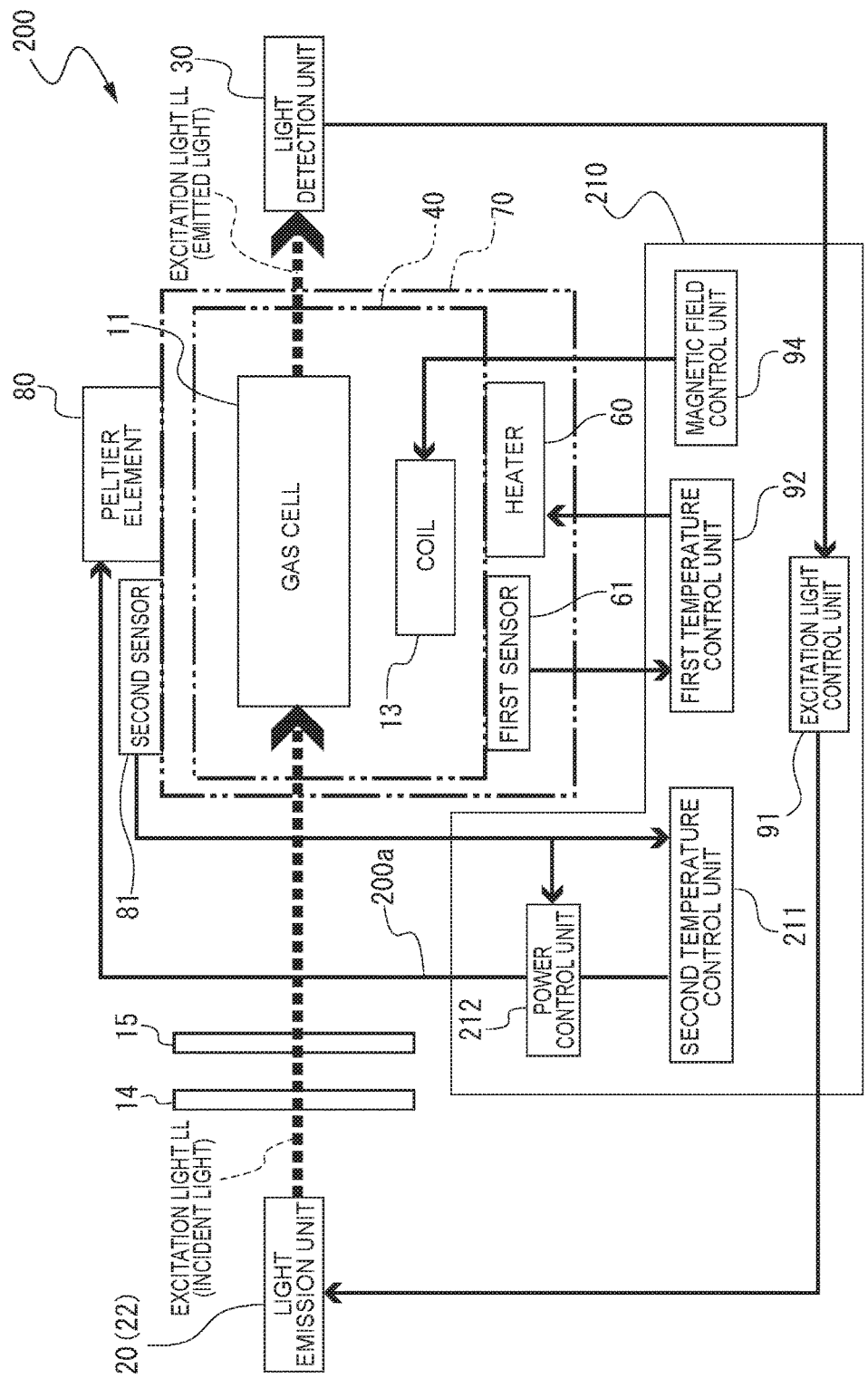
FIG. 8 is a schematic diagram showing a configuration of an atomic oscillator according to a third embodiment.

FIG. 8 is a schematic diagram showing a basic configuration of an atomic oscillator 200 according to a third embodiment. Meanwhile, the atomic oscillator 200 according to this embodiment is different from the atomic oscillator 100 according to the first embodiment in terms of a configuration of the control unit 90 described in FIG. 3, and other configurations thereof are the same as those in the configurations shown FIGS. 1 and 2. Therefore, the same components are denoted by the same reference numerals and signs as those in the atomic oscillator 100 according to the first embodiment, and a description thereof will not be repeated.

As shown in FIG. 8, a control unit 210 is provided with an excitation light control unit 91, a first temperature control unit 92, and a magnetic field control unit 94 that are the same as in the described above control unit 90 of the atomic oscillator 100 according to the first embodiment. In addition, the control unit 210 includes a second temperature control unit 211 as a second temperature control unit, and a power control unit 212 as a power control unit is provided in an intermediate portion of a control path 200a connecting the second temperature control unit 211 and the Peltier element 80 to each other. The power control unit 212 has a switching function of at least turning on or turning off a control signal or operation power which is output from the second temperature control unit 211 toward the Peltier element 80 on the basis of detection temperature data obtained from the second sensor 81.

The gas cell 11 being heated to a predetermined temperature by the first sensor 61 is the same as that in the atomic oscillator 100 according to the first embodiment, and thus a description thereof will not be repeated. In the atomic oscillator 200 according to the third embodiment, a control signal or operation power which is applied to the Peltier element 80 included in a second magnetic shield 70 from the second temperature control unit 211 can be further controlled by the power control unit 212 included in the middle of the control path 200a.

Functions of the second temperature control unit 211 and the power control unit 212 will be described. In the atomic oscillator 100 according to the first embodiment, a second temperature control unit 93 operates a heater 60, for example, at the time of starting up the atomic oscillator 100 on the basis of detection temperature data obtained from the second sensor 81, and operates a connection surface 80a of the Peltier element 80 as a heating surface, and thus it is possible to increase the temperature of the gas cell 11 in a short period of time. Alternatively, in a case where the heating of the gas cell 11 which is performed by the heater 60 is overshot or in a case where the surrounding environment of the atomic oscillator 100 is an environment at a temperature higher than a desired temperature of the gas cell 11, an operation is performed with the connection surface 80a of the Peltier element 80 as a cooling surface, and thus it is possible to cool the temperature of the gas cell 11 in a short period of time.

In the case of the first embodiment, the Peltier element 80 is configured such that the connection surface 80a is switched to a cooling surface and a heating surface depending on a change in the temperature of a surrounding environment. For example, in a case where the connection surface 80a of the Peltier element 80 is switched from a cooling surface to a heating surface, a region of the connection surface 80a of the Peltier element 80 changes to a low temperature portion, and it is necessary to firstly heat the region of the connection surface 80a which is the low temperature portion when the connection surface 80a is switched to a heating surface by changing the direction of a current applied to the Peltier element 80. Accordingly, a so-called time lag may occur in which a time is required from the start of application of a control signal from the second temperature control unit 93 to a rise in the temperature of an internal space 71b of a second lid 71 of the second magnetic shield 70.

Similarly, in a case where the connection surface 80a of the Peltier element 80 is switched from a heating surface to a cooling surface, a region of the connection surface 80a of the Peltier element 80 changes to a high temperature portion, and it is necessary to firstly cool the region of the connection surface 80a which is the high temperature portion when the connection surface 80a is switched to a cooling surface by changing the direction of a current applied to the Peltier element 80. Accordingly, a so-called time lag may occur in which a time is required from the start of application of a control signal from the second temperature control unit 93 to a drop in the temperature of the internal space 71b of the second lid 71 of the second magnetic shield 70.

On the other hand, in the atomic oscillator 200 according to the third embodiment, the second temperature control unit 211 applies a control signal or a control current to the Peltier element 80 so as to operate the connection surface 80a as a cooling surface. In order to make the connection surface 80a of the Peltier element 80 function as a cooling surface, a threshold value with respect to detection temperature data, transmitted from the second sensor 81, for operating the connection surface 80a of the Peltier element 80 as a heating surface is set to be a temperature lower than that of an external temperature environment which is assumed or on design specifications in the second temperature control unit 211.

For example, in a case where a temperature of equal to or higher than −20° C. is assumed to be an external temperature environment, a so-called threshold value which is a condition for applying a control signal for switching the connection surface 80a of the Peltier element 80 from a cooling surface to a heating surface in the second temperature control unit 211 is set to a temperature of less than −20° C., for example, −30° C. which is a low temperature exceeding the assumed temperature, and thus it is possible to operate the connection surface 80a of the Peltier element 80 as a cooling surface even below the assumed external temperature environment (the above-mentioned temperature of equal to or higher than −20° C.).

As described above, the control of a basic operation of the second temperature control unit 211 is performed to constantly operate the connection surface 80a of the Peltier element 80 as a cooling surface. However, in the control of the second temperature control unit 211, the temperature of the internal space 71b in the second lid 71 of the second magnetic shield 70 accommodating the gas cell 11 is constantly decreased. The gas cell 11 is required to operate under a predetermined temperature environment, and thus the heater 60 is operated at all times so as to prevent over cooling. Therefore, power is supplied to the heater 60 and the Peltier element 80 at all times, which results in a substantial energy loss.

Consequently, in the atomic oscillator 200 according to this embodiment, the power control unit 212 is provided at an intermediate position of the control path 200a connecting the second temperature control unit 211 and the Peltier element 80 to each other. The detection temperature data of the second sensor 81 is input to the power control unit 212, and the following control is performed on the basis of the input detection temperature.

In a case where the temperature of the second magnetic shield 70, that is, the detection temperature of the second sensor 81 is higher than a predetermined temperature, a control signal or an operation current is applied from the second temperature control unit 211 through the control path 200a to the Peltier element 80 in the power control unit 212. At this time, the value of the operation current, that is, the amount of power supplied is controlled in accordance with the detection temperature of the second sensor 81. A large amount of power is supplied in a case where a temperature difference between the temperature of the second magnetic shield 70, that is, the detection temperature of the second sensor 81 and a predetermined temperature is large, and a small amount of power is supplied in a case where the temperature difference is small.

On the other hand, in a case where the temperature of the second magnetic shield 70, that is, the detection temperature of the second sensor 81 is lower than the predetermined temperature, the control path 200a is blocked, and the a control signal or an operation current is not applied from the second temperature control unit 211 to the Peltier element 80 in the power control unit 212. That is, a cooling operation of the connection surface 80a serving as a cooling surface of the Peltier element 80 is stopped. The control of the temperature of the gas cell 11 is performed by the heater 60 which is controlled by the first temperature control unit 92. However, even when the control path 200a is blocked by the power control unit 212, the second temperature control unit 211 continuously applies a control signal or an operation current for operating the connection surface 80a of the Peltier element 80 as a cooling surface.

As described above, the atomic oscillator 200 according to the third embodiment includes the power control unit 212 in the middle of the control path 200a, and thus the second temperature control unit 211 can perform a control operation for operating the connection surface 80a of the Peltier element 80 as a cooling surface as a normal state. In a case where the external temperature environment is a low temperature or the internal space 71b of the second magnetic shield 70 is over-cooled by a cooling operation of the Peltier element 80, it is possible to dispose the gas cell 11 accommodated in the second magnetic shield 70 in a predetermined temperature environment by blocking the control path 200a or adjusting the amount of power supplied to the Peltier element 80.

In addition, the connection surface 80a of the Peltier element 80 is operated as a cooling surface as a normal state, and thus it is possible to improve the operation efficiency of the Peltier element 80 by eliminating the need for operation switching (switching between a cooling surface and a heating surface) of the connection surface 80a of the Peltier element 80.

Fourth Embodiment

As a fourth embodiment, a temperature control method of the atomic oscillator 200 according to the third embodiment will be described. Although described above, the atomic oscillator 200 according to the third embodiment is different from the atomic oscillator 100 according to the first embodiment described in FIG. 3 in that the atomic oscillator includes a control unit 210 having a different configuration of a control unit 90. The control unit 210 is different from the control unit according to the third embodiment in terms of a second temperature control unit 211 and a power control unit 212, and other configurations are the same as those shown in FIGS. 1 to 3. Therefore, the same components are denoted by the same reference numerals and signs, and a description thereof will not be repeated.

Figure 9:
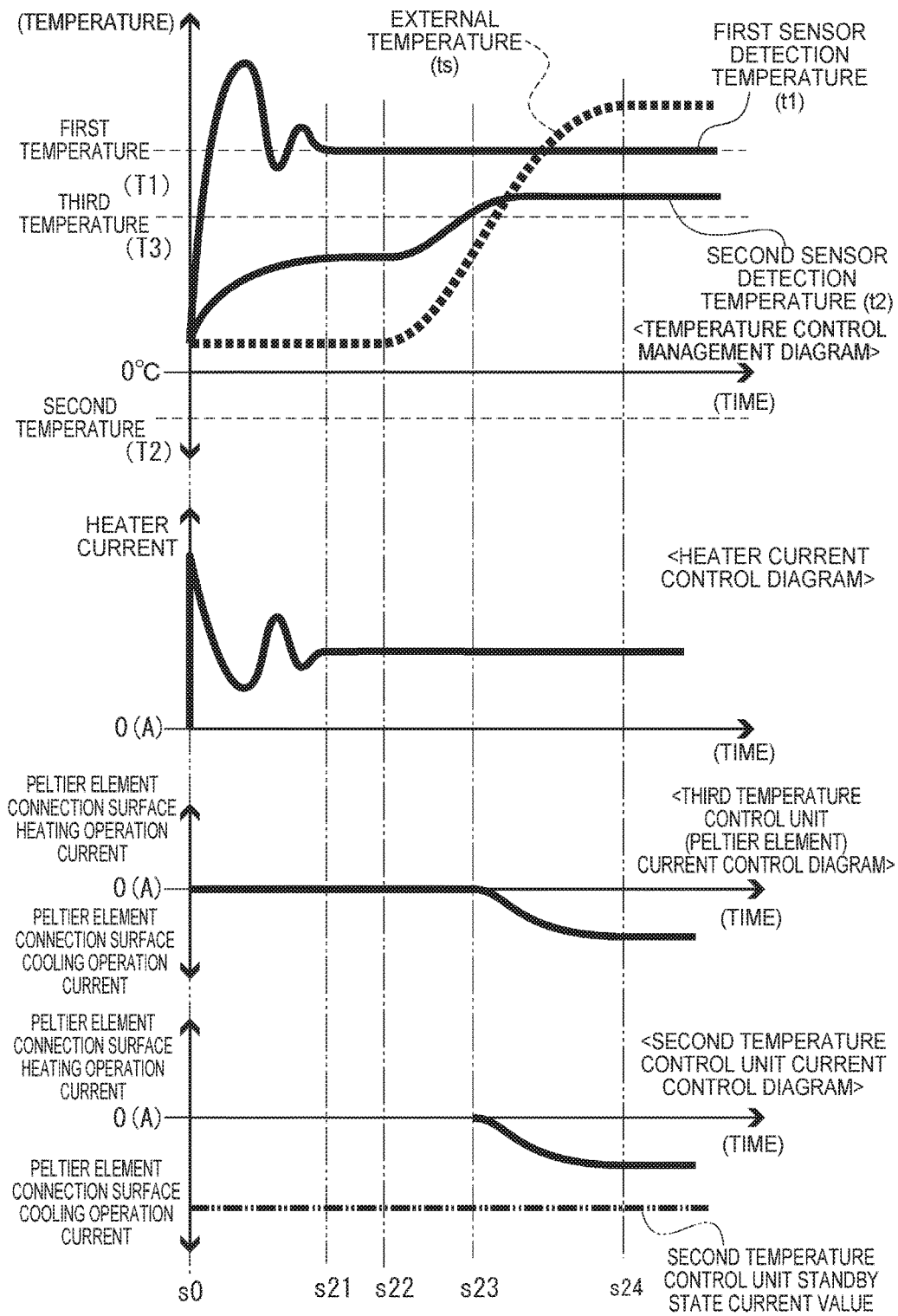
FIG. 9 shows a temperature control management diagram of a gas cell showing a temperature control method of an atomic oscillator according to the third embodiment, a heater current control diagram, a current control diagram of a power control unit, and a current control diagram of a Peltier element (temperature adjustment unit), as a fourth embodiment.

FIG. 9 shows a temperature control management diagram of a gas cell 11 showing a temperature control method of the atomic oscillator 200 according to the fourth embodiment, a heater current control diagram of a heater 60, a current control diagram in a power control unit 212 that controls a current applied to a Peltier element 80, and a current control diagram showing the application of a current to the Peltier element 80 in the second temperature control unit 211.

In the temperature control method of the atomic oscillator 200 according to the fourth embodiment, a second temperature control unit 211 as a unit that controls the temperature of the Peltier element 80 and the power control unit 212 are provided, and a control of generating a standby state current capable of applying a control current for operating a connection surface 80a of the Peltier element 80 as a cooling surface is performed at all times, as compared to the temperature control method of the atomic oscillator 100 according to the second embodiment. Specifically, as shown in the control management diagram of FIG. 9, a second temperature T2 serving as a threshold value of a control current applied to the Peltier element 80 by the second temperature control unit 211 is set as a switching temperature for switching the connection surface 80a of the Peltier element 80 in the second temperature control unit 211 to a cooling surface or a heating surface.

In this embodiment, in order for the second temperature control unit 211 to operate the connection surface 80a of the Peltier element 80 as a cooling surface at all times, a second temperature T2 is set to satisfy at least a condition of T2<T3 with respect to a third temperature T3 which is a management temperature of a second magnetic shield 70 which is detected by a second sensor 81. Further, it is preferable to satisfy a temperature condition of T2<$ts_{Min}$ with respect to a minimum temperature ($ts_{Min}$) in an environment condition on design specifications in which the atomic oscillator 200 is installed.

For example, in a case where conditions of $ts_{Min}$=15° C. and T3=50° C. are given, the relations of T2<T3 and T2<$ts_{Min}$ are reliably satisfied by setting T2 to −20° C. In this manner, it is preferable that the second temperature T2 which is set to a temperature far below the third temperature T3 satisfying the relation of T2<<T3, which is a condition for setting the above-mentioned second temperature T2, is applied as a threshold value of the second temperature control unit 211.

In this manner, the temperature control method of the atomic oscillator 200 according to this embodiment in which the third temperature T3 is set is performed as follows.

As shown in FIG. 9, a description is given of an example in which, at a time s0 when the atomic oscillator 200 is started up, the atomic oscillator is oscillated from a state where an external temperature ts in a region outside the second magnetic shield 70 satisfies the relations of ts<T1 and ts<T3 with respect to a first temperature T1 which is a control management temperature in a first temperature control unit 92 that controls at least the temperature of the gas cell 11 and a third temperature T3 which is a control management temperature in the power control unit 212 that controls the temperature of the connection surface 80a of the Peltier element 80.

The relations of ts<T1 and ts<T3 are established at the time s0 during the start-up of the atomic oscillator. Accordingly, a start-up current is applied to the heater 60, and the heater 60 starts to heat the gas cell 11.

On the other hand, in the Peltier element 80, the second temperature T2 serving as a threshold value is set to a temperature lower than the external temperature ts as described above, and thus the relation of T2<t2 is established. The second temperature control unit 211 operates to be able to apply a current having a direction and a value in which the connection surface 80a of the Peltier element 80 serves as a cooling surface. However, in the power control unit 212 installed in the middle of the control path 200a, a detection temperature t2 of the second sensor 81 is lower than the third temperature T3. Accordingly, a control of cutting off an operation current for operating the connection surface 80a of the Peltier element 80 which is applied from the second temperature control unit 211 as a cooling surface is performed, and the operation current is not supplied to the Peltier element 80, thereby setting a current to be in a supply standby state in the second temperature control unit 211.

The temperature of the gas cell 11 is increased by heating of the heater 60, and a current (power) required to maintain a first magnetic shield at the first temperature T1 is supplied to the heater 60 when the temperature of the gas cell 11, that is, a detection temperature t1 of a first sensor 61 converges to the first temperature T1 at a time s21.

The temperature of an internal space 71b of the second magnetic shield 70 accommodating the gas cell 11 is also increased by the gas cell 11 being heated by the heater 60, and the second sensor 81 detects a rise in the temperature. However, in a state where the detection temperature of the second sensor 81 is lower than the third temperature T3 which is a management temperature of the power control unit 212, the power control unit 212 continuously performs a control of cutting off an operation current for operating the connection surface 80a of the Peltier element 80 which is applied from the second temperature control unit 211 as a cooling surface, and thus the operation current is not supplied to the Peltier element 80.

In this embodiment, a situation in which the external temperature ts starts to rise from a time s22 will be described. Since the external temperature ts starts to rise from the time s22, the temperature t2 of the second sensor 81 starts to rise. The power control unit 212 continuously performs a control of cutting off an operation current for operating the connection surface 80a of the Peltier element 80 which is applied from the second temperature control unit 211 by the power control unit 212 as a cooling surface while the temperature t2 of the second sensor 81 is less than the third temperature T3, and the operation current is not supplied to the Peltier element 80.

The external temperature ts further rises and starts to exceed the third temperature T3 at a time s23, and the external temperature ts rises until a time s24. A state where the temperature is maintained at a constant temperature is assumed at the time s24 and the subsequent times.

When the external temperature ts exceeds the third temperature at the time s23, the power control unit 212 starts to supply an operation current for cooling the connection surface 80a to the Peltier element 80 from the second temperature control unit 211 which is set to be in a standby state. At this time, the power control unit 212 controls the amount of power capable of being supplied from the second temperature control unit 211 and the amount of power required to cool the connection surface 80a to the Peltier element 80 on the basis of the detection temperature t2 of the second sensor 81, and applies the power to the Peltier element 80 through the control path 200a.

During a period from a further rise in the external temperature ts to the time s24 at which a constant temperature state is set, the power control unit 212 performs a control of applying an ability to cool the connection surface 80a to the Peltier element 80 to the Peltier element 80 through the control path 200a by adjusting the amount of power capable of being supplied from the second temperature control unit 211, on the basis of a rise in the external temperature ts, that is, the detection temperature t2 of the second sensor 81. The amount of power capable of being supplied from the second temperature control unit 211 is adjusted so as to cool the connection surface 80a to the Peltier element 80 by a control operation of the power control unit 212 for maintaining the temperature t1 of the first magnetic shield at the first temperature T1 from the time s24, and a predetermined amount of power is transmitted to the Peltier element 80 through the control path 200a.

In the above-described temperature control method of the atomic oscillator 200, the second temperature control unit 211 performs a control for attempting to apply an operation current for operating the connection surface 80a of the Peltier element 80 as a cooling surface regardless of changes in the external temperature ts. The power control unit 212 provided in the middle of the control path 200a controls the amount of power supplied to the Peltier element 80 in the control path 200a of an operation current for operating the connection surface 80a of the Peltier element 80 as a cooling surface which is applied from the second temperature control unit 211. Thereby, the supply of the operation current to the Peltier element 80 with respect to the changes in the external temperature ts is adjusted so that the temperature of the second magnetic shield 70, in other words, the detection temperature t2 of the second sensor 81 is set to a predetermined third temperature T3. Therefore, it is possible to obtain the atomic oscillator 200 having an accurate oscillation performance which is stable with respect to changes in an external temperature environment, particularly, a high temperature environment.

Fifth Embodiment

Figure 10:
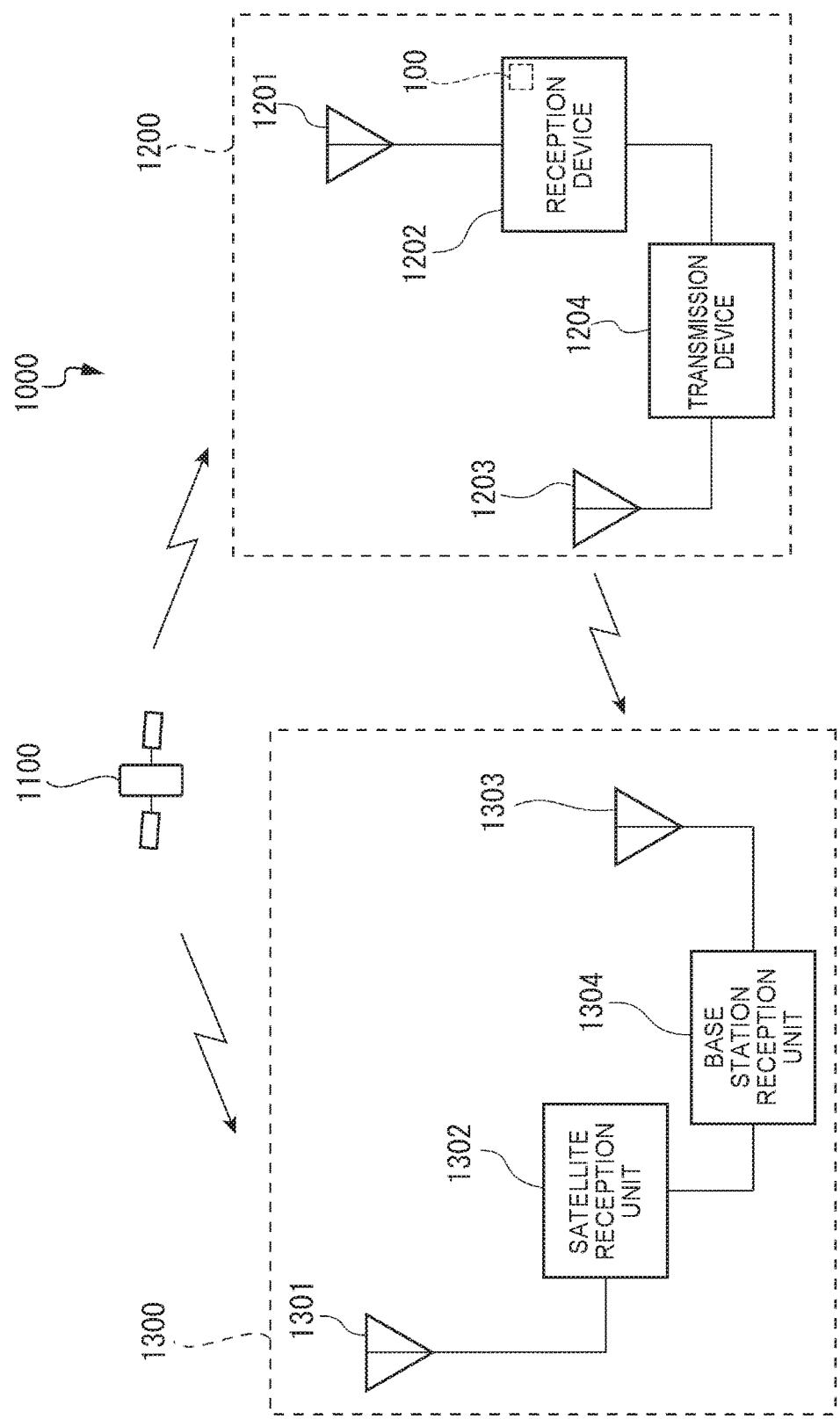
FIG. 10 is a diagram showing a schematic configuration of a positioning system using a GPS satellite as an example of an electronic apparatus according to a fifth embodiment.

As a fifth embodiment, a positioning system using a GPS satellite will be described as an example of an electronic apparatus including either the atomic oscillator 100 according to the first embodiment or the atomic oscillator 200 according to the third embodiment. FIG. 10 is a diagram showing a schematic configuration in a case where the atomic oscillator according to the invention is used for the positioning system using a GPS satellite. Meanwhile, in this embodiment, a configuration including the atomic oscillator 100 according to the first embodiment will be described.

A positioning system 1000 shown in FIG. 10 includes a GPS satellite 1100, a base station device 1200, and a GPS reception device 1300. The GPS satellite 1100 transmits positioning information (GPS signal). The base station device 1200 includes a reception device 1202 that receives positioning information from the GPS satellite 1100 with a high level of accuracy through an antenna 1201 installed, for example, at an electronic reference point (GPS continuous observation station), and a transmission device 1204 that transmits the positioning information, which is received by the reception device 1202, through an antenna 1203.

Here, the reception device 1202 is an electronic device including the atomic oscillator 100 mentioned above of the first embodiment according to the invention as the reference frequency oscillation source thereof. The reception device 1202 has excellent reliability. In addition, the positioning information received by the reception device 1202 is transmitted by the transmission device 1204 in real time. The GPS reception device 1300 includes a satellite reception unit 1302 that receives positioning information from the GPS satellite 1100 through an antenna 1301, and a base station reception unit 1304 that receives positioning information from the base station device 1200 through an antenna 1303.

Sixth Embodiment

Figure 11:
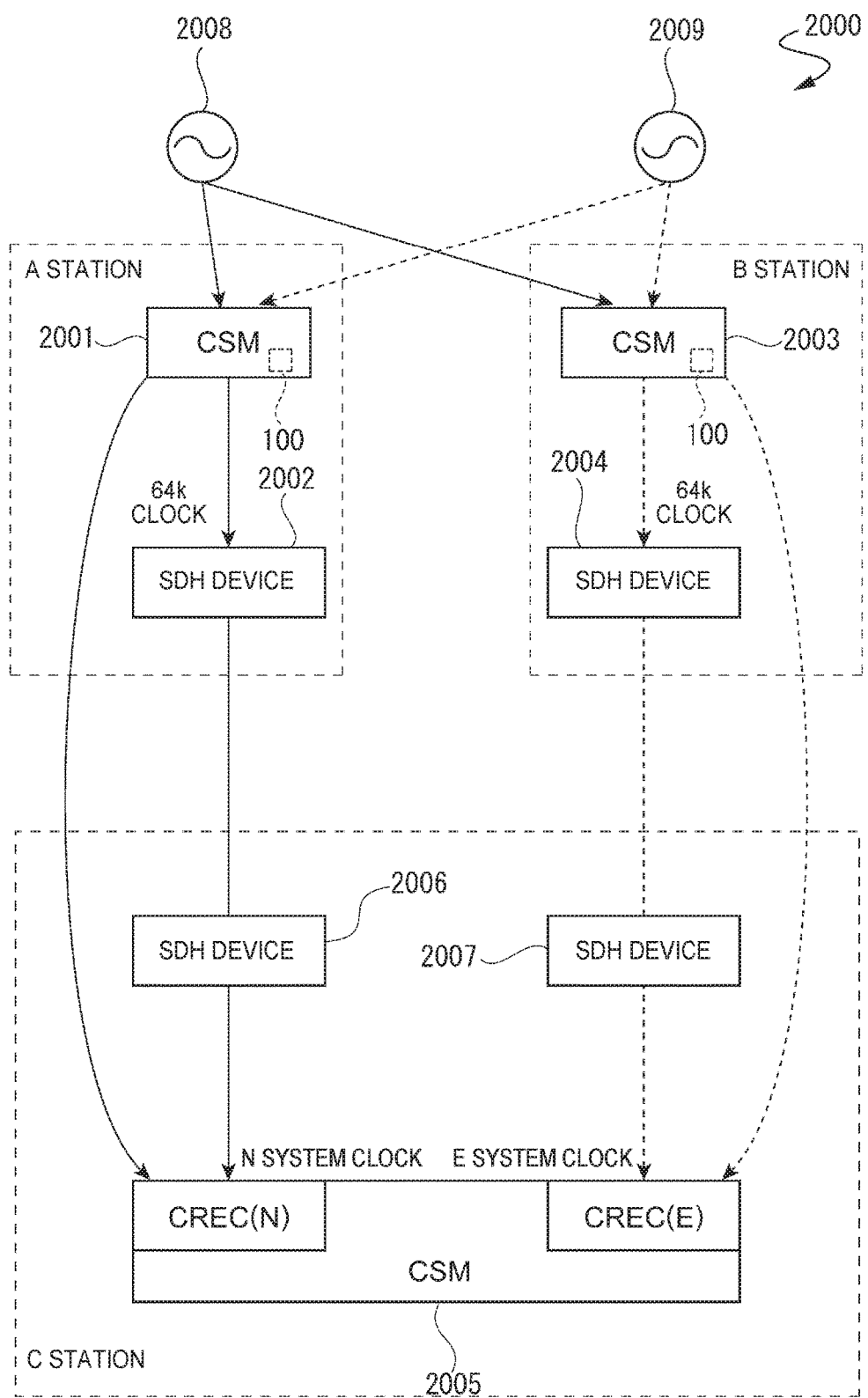
FIG. 11 is a diagram showing a schematic configuration of a clock transmission system as an example of an electronic apparatus according to a sixth embodiment.

As a sixth embodiment, a clock transmission system will be described an example of an electronic apparatus including either the atomic oscillator 100 according to the first embodiment or the atomic oscillator 200 according to the third embodiment. FIG. 11 is a diagram showing a schematic configuration in a case where the atomic oscillator according to the invention is used for a clock transmission system. Meanwhile, in this embodiment, a configuration including the atomic oscillator 100 according to the first embodiment will be described.

A clock transmission system 2000 shown in FIG. 11 conforms clocks of respective devices within a network of a time division multiplex system to each other, and is a system having a redundant configuration of a normal (N) system and an emergency (E) system.

The clock transmission system 2000 includes a clock supply module (CSM) 2001 and a synchronous digital hierarchy (SDH) device 2002 of an A station (upper (N system)), a clock supply module 2003 and an SDH device 2004 of a B station (upper (E system)), and a clock supply module 2005 and SDH devices 2006 and 2007 of a C station (lower). The clock supply module 2001 includes an atomic oscillator 100, and generates a clock signal of the N system. The atomic oscillator 100 in the clock supply module 2001 generates a clock signal in synchronization with a more accurate clock signal applied from master clocks 2008 and 2009 including an atomic oscillator using cesium.

The SDH device 2002 performs the transmission and reception of a main signal on the basis of a clock signal applied from the clock supply module 2001, superimposes the clock signal of the N system on the main signal, and transmits the superimposed signals to the lower clock supply module 2005. The clock supply module 2003 includes an atomic oscillator 100 and generates a clock signal of the E system. The atomic oscillator 100 in the clock supply module 2003 generates a clock signal in synchronization with a more accurate clock signal applied from the master clocks 2008 and 2009 including an atomic oscillator using cesium.

The SDH device 2004 performs the transmission and reception of a main signal on the basis of a clock signal applied from the clock supply module 2003, superimposes the clock signal of the E system on the main signal, and transmits the superimposed signals to the lower clock supply module 2005. The clock supply module 2005 receives clock signals applied from the clock supply modules 2001 and 2003, and generates a clock signal in synchronization with the received clock signal.

Here, the clock supply module 2005 normally generates a clock signal in synchronization with the clock signal of the N system which is applied from the clock supply module 2001. In a case where an abnormality occurs in the N system, the clock supply module 2005 generates a clock signal in synchronization with the clock signal of the E system which is applied from the clock supply module 2003. Switching from the N system to the E system is performed in this manner, and thus it is possible to secure stable clock supply and to increase the reliability of a clock path network. The SDH device 2006 performs the transmission and reception of a main signal on the basis of the clock signal applied from the clock supply module 2005. Similarly, the SDH device 2007 performs the transmission and reception of a main signal on the basis of the clock signal applied from the clock supply module 2005. Thereby, it is possible to synchronize the module of the C station with the module of the A station or the B station.

Seventh Embodiment

Figure 12:
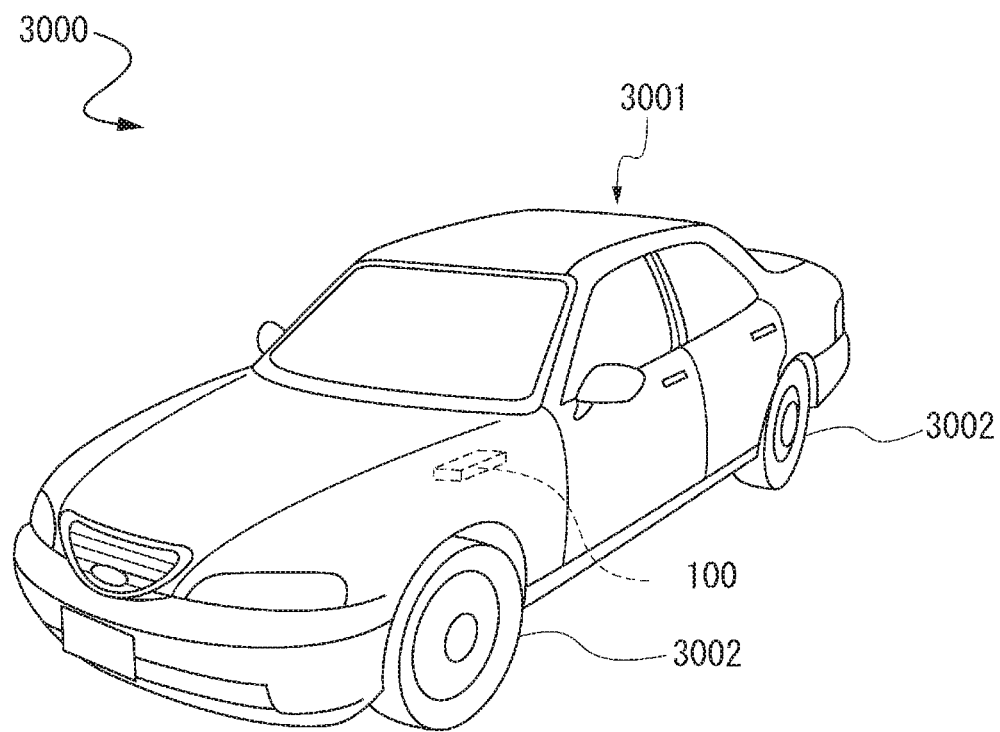
FIG. 12 is a perspective view showing a configuration of a vehicle as an example of a moving object according to a seventh embodiment.

As a seventh embodiment, a vehicle will be described as an example of a moving object including either the atomic oscillator 100 according to the first embodiment or the atomic oscillator 200 according to the third embodiment. FIG. 12 is a perspective view showing a schematic configuration in a case where the atomic oscillator according to the invention is used for the vehicle as a moving object. Meanwhile, in this embodiment, a configuration including the atomic oscillator 100 according to the first embodiment will be described.

A vehicle 3000 as a moving object shown in FIG. 12 includes a vehicle body 3001 and four wheels 3002, and is configured to rotate the wheels 3002 by a power source, not shown in the drawing, which is provided in the vehicle body 3001. The vehicle 3000 has the atomic oscillator 100 built therein. For example, a control unit not shown in the drawing controls the driving of the power source on the basis of an oscillation signal applied from the atomic oscillator 100.

Meanwhile, an electronic apparatus or a moving object having the atomic oscillator according to the invention incorporated therein are not limited to the above-mentioned apparatus or moving object, and can be applied to, for example, a mobile phone, a digital still camera, an ink jet type discharge apparatus (for example, an ink jet printer), a personal computer (a mobile personal computer and a laptop type personal computer), a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), a flight simulator, and the like.

As described above, the atomic oscillator according to the invention has been described with reference to the accompanying drawings, but the invention is not limited thereto. For example, a configuration of each unit in the above-described embodiment can be replaced with any configuration exhibiting the same function, and can also have any configuration added thereto. In addition, the invention may have a combination of any configurations of the above-described embodiments.

What is claimed is:

1. An atomic oscillator comprising:
   a gas cell that has metal atoms sealed therein;
   a coil that is disposed in a vicinity of the gas cell;
   a first magnetic shield that accommodates the gas cell and the coil therein;
   a heater that is configured to heat the gas cell;
   a first temperature sensor that is configured to detect a temperature of the gas cell;
   a second magnetic shield that accommodates the heater, the first temperature sensor, and the first magnetic shield therein;
   a temperature adjustment element; and
   a second temperature sensor that is disposed outside the second magnetic shield to detect a temperature,
   wherein the heater is controlled based on the detected temperature by the first temperature sensor so as to maintain the gas cell at a first temperature,
   the temperature adjustment element is controlled based on the detected temperature by the second temperature sensor so as to maintain the first magnetic shield at a second temperature, and
   the second temperature is lower than the first temperature.

2. The atomic oscillator according to claim 1, further comprising:
   a first temperature controller that is configured to control the operation of the heater based on the detected temperature by the first temperature sensor; and
   a second temperature controller that is configured to control the operation of the temperature adjustment element based on the detected temperature by the second temperature sensor.

3. The atomic oscillator according to claim 2, further comprising:
   a power controller that is configured to control power which is supplied to the temperature adjustment element,
   wherein the temperature adjustment element is connected to the second temperature controller via the power controller.

4. The atomic oscillator according to claim 1,
   wherein the temperature adjustment element is a Peltier element.

5. A temperature control method of an atomic oscillator, the atomic oscillator including:
   a gas cell that has metal atoms sealed therein;
   a coil that is disposed in a vicinity of the gas cell;
   a first magnetic shield that accommodates the gas cell and the coil therein;
   a heater that is configured to heat the gas cell;
   a first temperature sensor that is configured to detect a temperature of the gas cell,
   a second magnetic shield that accommodates the heater the first temperature sensor, and the first magnetic shield therein;
   a temperature adjustment element that is disposed outside of the second magnetic shield; and
   a second temperature sensor that is disposed outside the second magnetic shield, the method comprising:
   detecting the temperature of the gas cell by the first temperature sensor;
   controlling an operation of the heater based on the detected temperature by the first temperature sensor so as to maintain the gas cell at a first temperature;
   detecting a temperature of the second magnetic shield by the second temperature sensor; and
   controlling an operation of the temperature adjustment element based on the detected temperature by the second temperature sensor so as to maintain the first magnetic shield at a second temperature,
   wherein the second temperature is lower than the first temperature.

6. A temperature control method of an atomic oscillator, the atomic oscillator including,
   a gas cell that has metal atoms sealed therein;
   a coil that is disposed in a vicinity of the gas cell;
   a first magnetic shield that accommodates the gas cell and the coil therein;
   a heater that is configured to heat the gas cell;
   a first temperature sensor that is configured to detect a temperature of the gas cell;
   a second magnetic shield that accommodates the heater, the first temperature sensor, and the first magnetic shield therein;
   a temperature adjustment element that is disposed outside of the second magnetic shield; and
   a second temperature sensor that is disposed outside the second magnetic shield, the method comprising:
   detecting the temperature of the gas cell by the first temperature sensor;
   controlling an operation of the heater based on the detected temperature by the first temperature sensor so as to maintain the gas cell at a first temperature;
   detecting a temperature of the second magnetic shield by the second temperature sensor;
   controlling an operation of the temperature adjustment element based on the detected temperature by the second temperature sensor so as to maintain the first magnetic shield at a second temperature; and controlling an amount of power which is output to the temperature adjustment element so as to maintain the first magnetic shield at a third temperature.

7. The temperature control method of an atomic oscillator according to claim 6,
wherein when the first temperature is T1, the second temperature is T2, and the third temperature is T3, T1>T3>T2 is established.

* * * * *